United States Patent
Pang (10) Patent No.: US 11,955,982 B2
(45) Date of Patent: Apr. 9, 2024

(54) GRANULAR CLOCK FREQUENCY DIVISION USING DITHERING MECHANISM

(71) Applicant: ATI Technologies ULC, Markham (CA)

(72) Inventor: Erwin Chi Wang Pang, Markham (CA)

(73) Assignee: ATI Technologies ULC, Markham (CA)

( * ) Notice: Subject to any disclaimer, the term of this patent is extended or adjusted under 35 U.S.C. 154(b) by 101 days.

(21) Appl. No.: 17/853,323

(22) Filed: Jun. 29, 2022

(65) Prior Publication Data
US 2024/0007116 A1   Jan. 4, 2024

(51) Int. Cl.
*H03L 7/197* (2006.01)
*H03L 7/08* (2006.01)
*H03L 7/081* (2006.01)

(52) U.S. Cl.
CPC .......... *H03L 7/1974* (2013.01); *H03L 7/0805* (2013.01); *H03L 7/0816* (2013.01)

(58) Field of Classification Search
CPC .... H03L 7/1974; H03L 7/0805; H03L 7/0816
See application file for complete search history.

(56) References Cited

U.S. PATENT DOCUMENTS

| | | | | |
|---|---|---|---|---|
| 4,715,052 A * | 12/1987 | Stambaugh | ............ | H03K 23/44 377/105 |
| 5,172,400 A * | 12/1992 | Maemura | ............. | H03K 23/546 377/114 |
| 7,342,425 B1 * | 3/2008 | Kang | ................... | H03K 23/505 327/117 |
| 7,734,001 B2 * | 6/2010 | Saeki | .................... | H03L 7/1974 375/376 |
| 7,808,287 B2 * | 10/2010 | Miller | .................. | G06F 1/3287 327/117 |
| 8,280,934 B2 * | 10/2012 | Molnar | ..................... | G06F 7/68 708/103 |
| 8,314,639 B2 * | 11/2012 | Tsai | .......................... | G06F 1/08 327/117 |
| 9,385,769 B2 * | 7/2016 | Elzeftawi | ............... | H03B 19/12 |
| 9,425,805 B2 * | 8/2016 | Tanaka | ...................... | H03L 7/18 |
| 10,084,458 B1 * | 9/2018 | Kanagawa | ............ | G11C 16/08 |
| 10,530,375 B1 * | 1/2020 | Wang | ....................... | H03L 7/193 |
| 10,650,112 B1 * | 5/2020 | Krishnamurthy | ...... | H03K 3/037 |
| 11,362,666 B2 * | 6/2022 | Liu | ....................... | H03K 23/425 |

(Continued)

*Primary Examiner* — Adam D Houston
(74) *Attorney, Agent, or Firm* — Kowert, Hood, Munyon, Rankin & Goetzel, P.C.; Rory D. Rankin (57) ABSTRACT

An apparatus and method for efficiently generating clock signals. An integrated circuit includes multiple clock dividers both at its I/O boundaries and across its semiconductor die. A clock divider receives an input clock signal, and an indication of a reduction factor that is a positive, non-zero and a non-integer value less than one. The clock divider generates an output clock signal based on the input clock signal and the reduction factor. The reduction factor can be an M-bit pattern where M is a positive, non-zero integer greater than one. Therefore, the clock divider generates the output clock signal with a reduced clock rate that has a smallest configurable granularity that is 1/M of the input clock frequency. An asserted bit in the M-bit pattern indicates that the output clock signal should have an asserted value during a corresponding clock cycle of the input clock signal.

20 Claims, 6 Drawing Sheets

(56) References Cited

U.S. PATENT DOCUMENTS

| | | | |
|---|---|---|---|
| 11,632,119 B1* | 4/2023 | Sarkar | H03K 23/66 |
| | | | 327/117 |
| 2004/0140831 A1* | 7/2004 | Wang | H03K 23/667 |
| | | | 327/115 |
| 2005/0110532 A1* | 5/2005 | Kuroki | H03K 23/54 |
| | | | 327/115 |
| 2005/0110581 A1* | 5/2005 | Ngo | H03L 7/0996 |
| | | | 331/18 |
| 2011/0163784 A1* | 7/2011 | Loeda | H03K 23/68 |
| | | | 327/117 |
| 2012/0314833 A1* | 12/2012 | Venkatasubramanian | |
| | | | G06F 12/0815 |
| | | | 377/48 |
| 2017/0346470 A1* | 11/2017 | Goh | H03L 7/183 |
| 2018/0054203 A1* | 2/2018 | Drost | H03K 21/026 |
| 2018/0109266 A1* | 4/2018 | Gupta | H03K 19/20 |
| 2019/0173476 A1* | 6/2019 | He | H03K 23/588 |
| 2021/0336626 A1* | 10/2021 | Matei | H02M 1/15 |
| 2021/0376842 A1* | 12/2021 | Min | H03K 23/64 |
| 2023/0136815 A1* | 5/2023 | Whitaker | H03K 23/00 |
| | | | 713/503 |

* cited by examiner

GRANULAR CLOCK FREQUENCY DIVISION USING DITHERING MECHANISM

BACKGROUND

Description of the Relevant Art

Clock frequency dividers generate output clock signals with a frequency less than a frequency of received input clock signals. These clock frequency dividers are also used in a variety of other circuits. Examples are data de-serializers, frequency synthesizers, timing recovery circuits, equalization circuitry such as decision feedback equalization (DFE) circuits, and clock generators such as phase locked loops (PLLs) and intermediate on-die clock generators across a semiconductor die. Clock frequency dividers at the PLL affect the feedback path of the PLL, which determines a latency for locking the PLL. Additionally, the on-die circuits require the clock signal outputs from the one or more PLLs to have phase alignment. The DFE circuits are used in both a transmitter and a receiver that transfer electrical signals across multiple, parallel metal traces. The DFE circuits reduce the effects of intersymbol (ISI) that cause jitter for high-speed serial links and that result in errors in the decision circuitry at the receiver.

A variety of types of sequential circuits receive an input clock signal and additionally an input data signal or an input control signal. These types of sequential circuits synchronize the processing of data signals or control signals in a pipelined fashion. Examples of these sequential circuits are latches, flip-flops, word line drivers, bit line drives, and so on. Generally, sequential circuits have an associated overhead including a setup time and a hold time. When either the setup time or the hold time is violated, the signals within the sequential circuit and an associated output value become metastable, or unpredictable. If the output value settles to an incorrect value, data corruption occurs. However, even if the output value settles to a correct value, power consumption has increased. Additionally, the latency increases for the circuitry of the subsequent combinatorial logic that receives the output value. Therefore, the design of the clock frequency dividers both at the input/output (I/O) boundary and within the semiconductor die of an integrated circuit is critical in order to support a broad frequency range, reduce on-die area, reduce power consumption, increase performance, and decreases a number of failures, which increases system reliability.

In view of the above, methods and systems for efficiently generating clock signals are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods for efficiently generating clock signals are contemplated. An integrated circuit includes multiple clock frequency dividers both at its I/O boundaries and across its semiconductor die (or die). A clock frequency divider (or clock divider) generates an output clock signal with a frequency less than a frequency of a received input clock signal. The hardware, such as circuitry, of the clock divider receive the input clock signal, and receives an indication of a configurable input clock frequency reduction factor (or reduction factor). In various implementations, the reduction factor is a positive, non-zero and a non-integer value. In some implementations, the clock divider receives an indication of the reduction factor as a ratio of N to M by receiving the two values N and M. Here, each of N and M is a positive, non-zero integer, and N is less than M. Therefore, M is also greater than one. In an implementation, the value N is the numerator of the ratio that indicates a number of clock cycles of each M clock cycles of the input clock signal that the output clock signal is asserted. The value M is the denominator of the ratio. In another implementation, the value N indicates a number of clock cycles of each M clock cycles of the input clock signal that the output clock signal is negated. The clock divider generates an output clock signal based on the input clock signal and the reduction factor. Therefore, the clock divider generates the output clock signal with a reduced clock rate that is N/M of the input clock frequency. In other words, the output clock frequency is (N/M)×(input clock frequency). The output clock frequency is a multiplicative product of the ratio N/M and the input clock frequency. Both the supported sizes (or ranges) and the values of N and M determine the output clock frequency. In various implementations, the clock divider generates the output clock signal with a reduced clock rate that has a smallest configurable granularity that is 1/M of the input clock frequency.

The circuitry of the clock divider includes a clock gating circuit that receives the input clock signal and a clock enable signal, and the clock gating circuit generates the output clock signal based on the input clock signal and the clock enable signal. The circuitry of the clock divider also includes a control circuit, which is also referred to as a modulation control block or a modulator. The control circuit receives the input clock signal and the indication of the reduction factor, and generates the clock enable signal used by the clock gating circuit based on the input clock signal and the received indication. As described earlier, in some implementations, the control circuit of the clock divider receives the indication of the reduction factor as the ratio of N to M. In an implementation, the control circuit receives the two values N and M, and the control circuit determines the ratio based on the received values. In another implementation, the control circuit of the clock divider receives the indication of the reduction factor as an M-bit pattern where M is a positive, non-zero integer greater than one. One or more bits of the M-bit pattern, such as a number N bits of the M-bit pattern, indicate a value of the clock enable signal during a clock cycle of the input clock signal.

In an implementation, an asserted bit in the M-bit pattern indicates that the output clock signal should have an asserted value during a corresponding clock cycle of the input clock signal. Similarly, a negated bit in the M-bit pattern indicates that the output clock signal should have a negated value during a corresponding clock cycle of the input clock signal. In other words, in an implementation, the number of N asserted bits in the M-bit pattern indicates a number of clock cycles of each M clock cycles of the input clock signal that the output clock signal is asserted. Therefore, a number (M-N) bits of the M-bit pattern are negated. In another implementation, the number of N negated bits in the M-bit pattern indicates a number of clock cycles of each M clock cycles of the input clock signal that the output clock signal is asserted. Therefore, a number (M-N) bits of the M-bit pattern are asserted.

Using the received M-bit pattern, the clock divider generates the output clock signal with a reduced clock rate that has a smallest configurable granularity of 1/M of the input clock frequency. In other words, the reduced clock rate of the output clock signal has a configurable granularity of reduction of 1/M of the input clock frequency, 2/M of the input clock frequency, 3/M of the input clock frequency, and so on to (M-1)/M of the input clock frequency. In an implementation, a 5-bit pattern of 5'b11000 received by the control circuit of the clock divider causes the clock divider to generate the output clock signal with an output clock frequency that is ⅖ (or 40%) of the input clock frequency. Here, the notation "5'b" indicates 5 values with each value being a binary value or a binary digit or a bit. In addition, a binary '1' is used as an asserted value and a binary '0' is used as a negated value. However, in other implementations, the binary values are switched regarding which one indicates an asserted value and which one indicates a negated value.

In another implementation, the control circuit of the clock divider receives the indication of the reduction factor as the ratio of N to M by receiving the two values N and M. Here, N is the numerator of the ratio with the value of 2 and M is the denominator of the ratio with the value of 5. The control circuit determines the ratio of ⅖ (or 40%), and the clock divider generates the output clock signal with a number of clock cycles being asserted of each M clock cycles of the input clock signal based on the determined ratio and the design choice of whether the ratio indicates a ratio of asserted clock cycles to M clock cycles or negated clock cycles to M clock cycles. The design choice can be based on design requirements. Further details of efficiently generating clock signals are provided in the following discussion.

Figure 1:
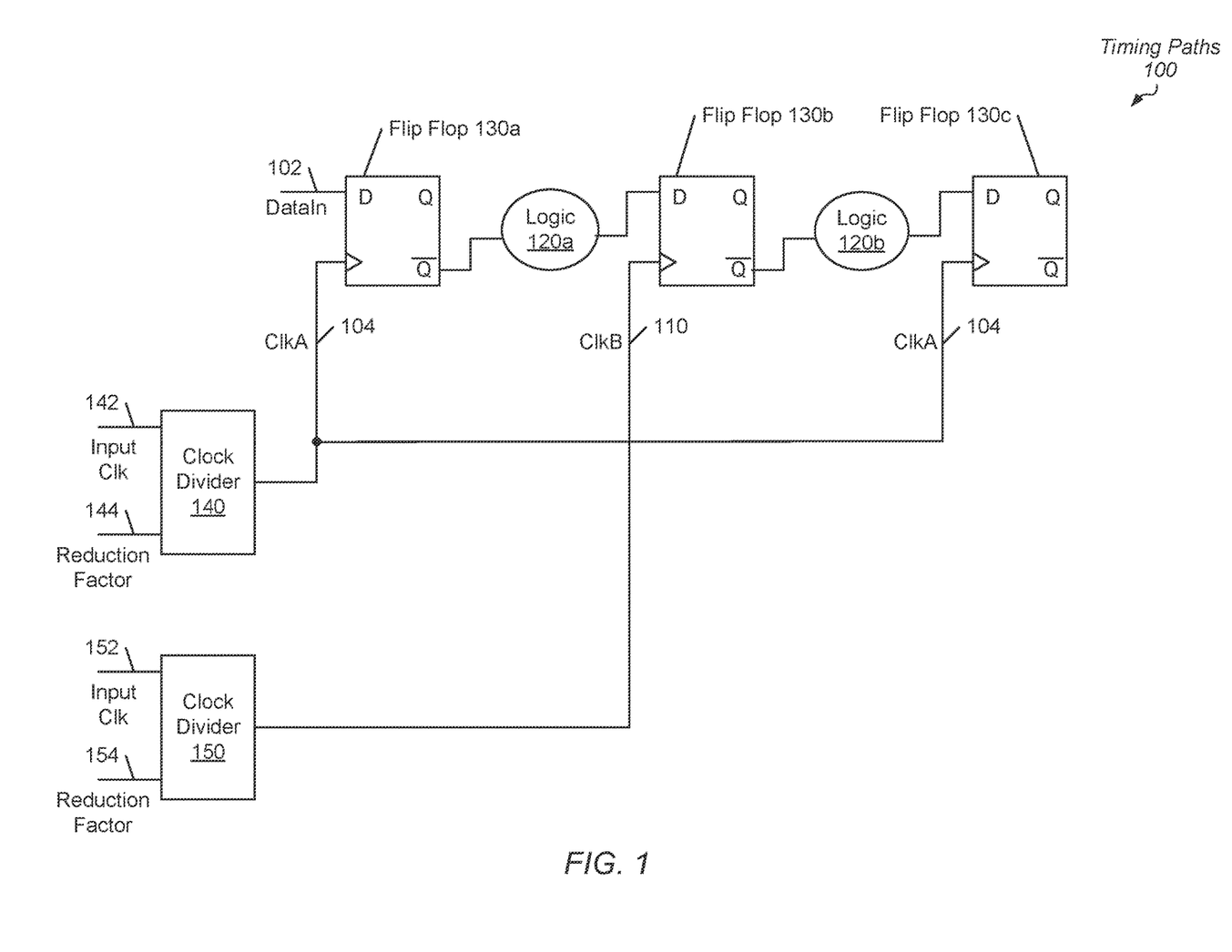
FIG. 1 is a generalized block diagram of timing paths using sequential elements and an efficient clock frequency divider.

Referring to FIG. 1, a generalized block diagram is shown of timing paths 100 using sequential elements and an efficient clock frequency divider. The timing paths 100 does not include all examples of timing paths such as replacing a flip-flop circuit with a single latch circuit, replacing combinatorial logic with dynamic logic, or replacing logic with a memory such as a random access memory (RAM) cell or a register file circuit. The timing paths 100 shown is for a simple illustrative purpose. Flip-flop circuits 130a-130c can use a master-slave latch configuration. Flip-flop circuits 130a-130c can also include single or double output lines, and one of many designs for feedback circuits and scan circuitry. A data input signal is received by line DataIn 102. As shown, flip-flops 130a and 130c receive a same clock signal, ClkA, on line 104. Flip-flop circuit 130b receives a clock signal, ClkB, on line 110.

A first timing path exists between the output of flip-flop 130a and the input of flip-flop 130b. Combinatorial logic, Logic 120a, receives the output of flip-flop 130a, performs combinatorial computations dependent on the output of flip-flop 130a, and conveys an output value to the input of flip-flop 130b. A second timing path including logic 120b exists between flip-flops 130b-130c. In some implementations, the clock waveform ClkB 110 has a same duty cycle as clock waveform ClkA 104 but is delayed from ClkA 104 by a particular delay amount. As shown, the clock divider 140 receives the input Clk on line 142, receives the reduction factor 144, and generates the clock signal ClkA 104. In various implementations, the clock signal ClkA 104 has a clock frequency that is less than a clock frequency of the input Clk 142.

In a similar manner, the clock divider 150 receives the input Clk on line 152, receives the reduction factor 154, and generates the clock signal ClkB 110. In various implementations, the clock signal ClkB 110 has a clock frequency that is less than a clock frequency of the input Clk 152. In various implementations, each of the reduction factors 144 and 154 is a positive, non-zero and a non-integer value. The clock dividers 140 and 150 generate output clock signals 104 and 110 based on the input clock signals 142 and 152 and the reduction factors 144 and 154. Therefore, the clock divider 140 generates the output clock signal 104 with a reduced clock rate that is less than the input clock frequency of the input clock signal 142. The clock divider 150 generates the output clock signal 110 with a reduced clock rate that is less than the input clock frequency of the input clock signal 152. In various implementations, the clock divider 140 generates the output clock signal 104 with a reduced clock rate that has a smallest configurable granularity that is 1/M of the input clock frequency of the input clock signal 142. Similarly, the clock divider 150 generates the output clock signal 110 with a reduced clock rate that has a smallest configurable granularity that is 1/M of the input clock frequency of the input clock signal 152.

In some implementations, the clock divider 140 receives an indication of the reduction factor 144 as a ratio of N to M by receiving the two values N and M. Here, each of N and M is a positive, non-zero integer, and N is less than M. Therefore, M is also greater than one. In an implementation, the value N indicates a number of clock cycles of each M clock cycles of the input clock signal 142 that the output clock signal 104 is asserted. In another implementation, the value N indicates a number of clock cycles of each M clock cycles of the input clock signal 142 that the output clock signal 104 is negated. In some implementations, the clock divider 140 receives the indication of the reduction factor 144 as the ratio of N to M where N is the numerator of the ratio and M is the denominator of the ratio. In other words, the output clock frequency of output clock signal 104 is (N/M)×(input clock frequency of input clock signal 142). The output clock frequency of the output clock signal 104 is a multiplicative product of the ratio N/M and the input clock frequency of the input clock signal 142. Both the supported sizes (or ranges) and the values of N and M determine the output clock frequency of output clock signal 104. Similar relationships exist for the output clock signal 110 and the input clock signal 152.

In an implementation, the clock divider 140 receives the two values N and M, and the clock divider 140 determines the ratio based on the received values. In another implementation, the clock divider 140 receives the indication of the reduction factor 144 as an M-bit pattern where M is a positive, non-zero integer greater than one. One or more bits of the M-bit pattern, such as a number N bits of the M-bit pattern, indicate a number of clock cycles of each M clock cycles of the input clock signal 142 that the output clock signal 104 is asserted. Therefore, a number (M-N) of clock cycles of each M clock cycles of the input clock signal 142 is negated for the output clock signal 104. The assertion and negation of clock cycles can be switched in other implementations. One or more of these implementations for the clock divider 140 are also possible and contemplated for the clock divider 150 and corresponding signals (and values) 152, 154 and 110.

Figure 2:
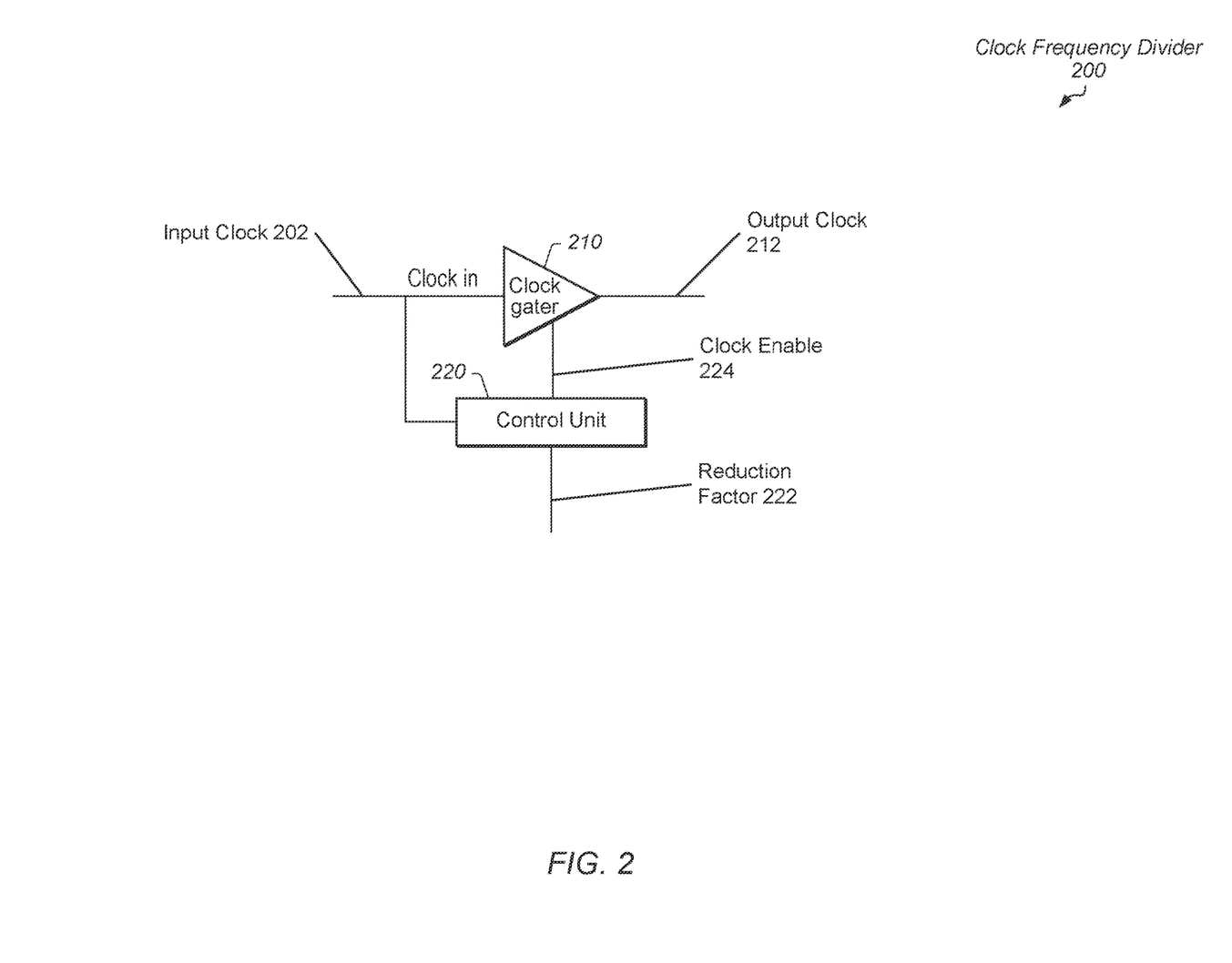
FIG. 2 is a generalized block diagram of an efficient clock frequency divider.

Turning now to FIG. 2, a generalized block diagram is shown of an efficient clock frequency divider 200. The clock frequency divider 200 (or clock divider 200) includes the clock gating circuit 210, and the control circuit 220, which is also referred to as a modulation control block 220 or a modulator 220. The clock gating circuit 210 generates the output clock signal 212 based on the input clock signal 202 and the clock enable signal 224. The control circuit 220 receives the input clock signal 202 and the indication of the reduction factor 222, and based on these inputs, the control circuit 220 generates the clock enable signal 224 used by the clock gating circuit 210.

In some implementations, the control circuit 220 of the clock divider 200 receives the indication of the reduction factor 222 as an M-bit pattern where M is a positive, non-zero integer greater than one. One or more bits of the M-bit pattern, such as a number N bits of the M-bit pattern, indicate a value of the clock enable signal 224 during a clock cycle of the input clock signal 202. In an implementation, an asserted bit in the M-bit pattern indicates that the output clock signal 212 should have an asserted value during a corresponding clock cycle of the input clock signal 202. Similarly, a negated bit in the M-bit pattern indicates that the output clock signal 212 should have a negated value during a corresponding clock cycle of the input clock signal 202. In other words, in an implementation, the number of N asserted bits in the M-bit pattern of the reduction factor 222 indicates a number of clock cycles of each M clock cycles of the input clock signal 202 that the output clock signal 212 is asserted. Therefore, a number (M-N) bits of the M-bit pattern of the reduction factor 222 are negated. In another implementation, the number of N negated bits in the M-bit pattern of the reduction factor 222 indicates a number of clock cycles of each M clock cycles of the input clock signal 202 that the output clock signal 212 is asserted. Therefore, a number (M-N) bits of the M-bit pattern of the reduction factor 222 are asserted.

Using the received M-bit pattern, the clock divider 200 generates the output clock signal 212 with a reduced clock rate that has a smallest configurable granularity of 1/M of the input clock frequency of the input clock signal 202. In other words, the reduced clock rate of the output clock signal 212 has a configurable granularity of reduction of 1/M of the input clock frequency, 2/M of the input clock frequency, 3/M of the input clock frequency, and so on to (M-1)/M of the input clock frequency. In an implementation, a 5-bit pattern of 5'b11000 received as the reduction factor 222 by the control circuit 220 causes the clock divider 200 to generate the output clock signal 212 with an output clock frequency that is ⅖ (or 40%) of the input clock frequency. Here, the notation "5'b" indicates 5 values with each value being a binary value or a binary digit or a bit. In addition, a binary '1' is used as an asserted value and a binary '0' is used as a negated value. However, in other implementations, the binary values are switched regarding which one indicates an asserted value and which one indicates a negated value. For example, a binary '0' is used as an asserted value and a binary '1' is used as a negated value. The choice of which binary value indicates an asserted value is based on design requirements such as the type of transistor that receives the binary value among other design (circuit, microarchitecture) considerations.

In another implementation, the control circuit 220 of the clock divider 200 receives the indication of the reduction factor 222 as a ratio of N to M by receiving the two values N and M. Here, each of N and M is a positive, non-zero integer, and N is less than M. Therefore, M is also greater than one. In an implementation, the value N is the numerator with the value of 2 and M is the denominator with the value of 5. The control circuit 220 determines the ratio of ⅖ (or 40%) from the received values N and M, and in an implementation, the clock divider 200 generates the output clock signal 212 with 2 clock cycles being asserted for every 5 clock cycles of the input clock signal 202. Therefore, the clock divider 200 generates the output clock signal 212 with 3 (M-N) clock cycles being negated for every 5 clock cycles of the input clock signal 202. In another implementation, the control circuit 220 determines the ratio of ⅖ (or 40%) from the received values N and M, and the clock divider 200 generates the output clock signal 212 with 2 clock cycles being negated for every 5 clock cycles of the input clock signal 202. Therefore, the clock divider 200 generates the output clock signal 212 with 3 (M-N) clock cycles being asserted for every 5 clock cycles of the input clock signal 202.

Figure 3:
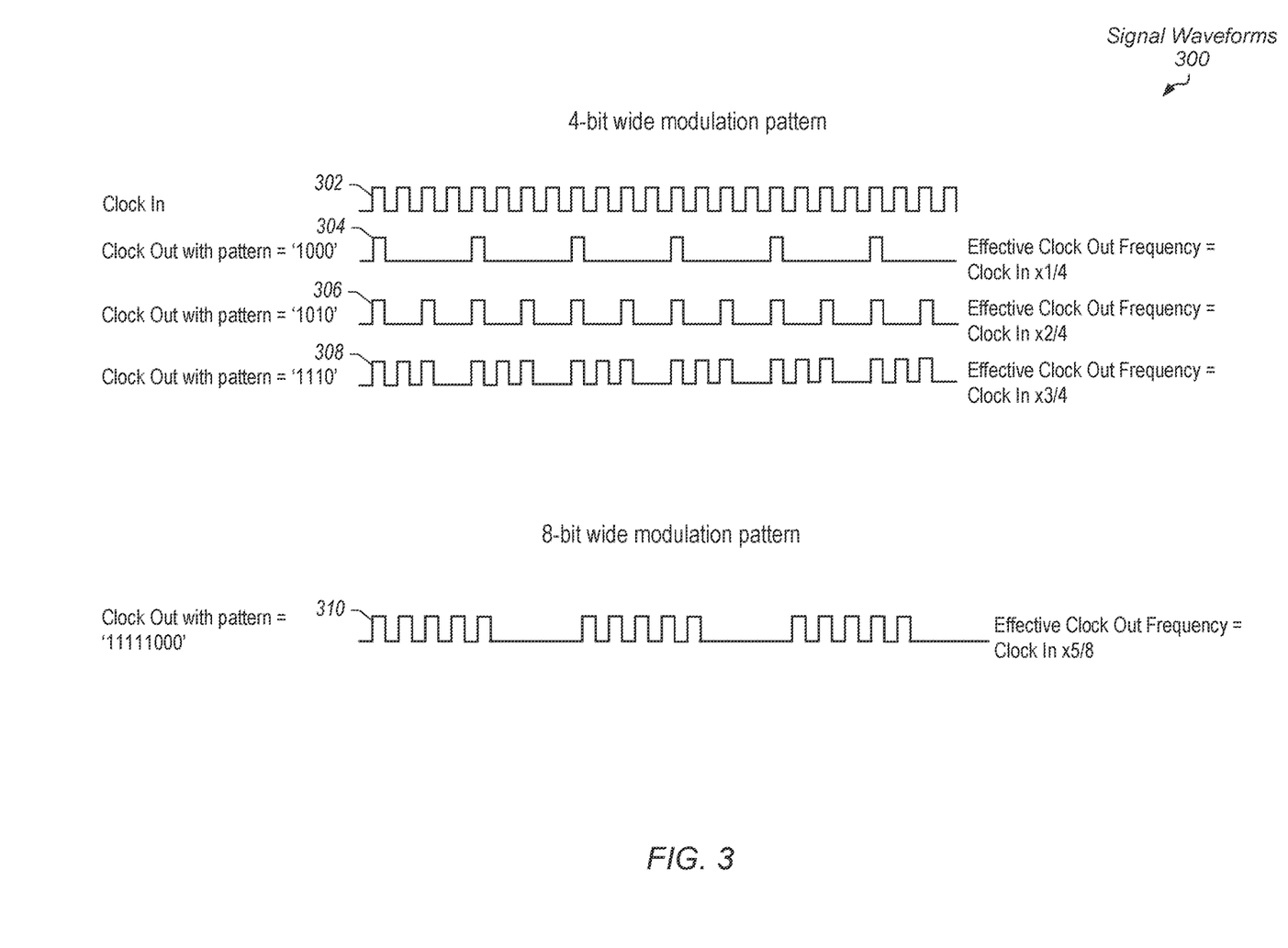
FIG. 3 is a generalized block diagram of signal waveforms generated by an efficient clock frequency divider.

Referring to FIG. 3, a generalized block diagram is shown of signal waveforms 300 generated by an efficient clock frequency divider. The signal waveforms 300 are clock signal waveforms. The signal waveform 302 is an input clock signal waveform. The signal waveforms 304-310 are output clock signal waveforms generated by a clock divider based on the signal waveform 302 and a corresponding reduction factor. The control circuit of the clock divider receives the input clock signal waveform 302 and the indication of the reduction factor, and generates the clock enable signal used by the clock gating circuit based on the input clock signal and the received indication. The clock gating circuit generates the output clock signal waveforms such as signal waveforms 304-310.

In some implementations, the control circuit of the clock divider receives the indication of the reduction factor as an M-bit pattern where M is a positive, non-zero integer greater than one. One or more bits of the M-bit pattern indicate a value of the clock enable signal during a clock cycle of the input clock signal. In an implementation, an asserted bit in the M-bit pattern indicates that the output clock signal should have an asserted value during a corresponding clock cycle of the input clock signal. Similarly, a negated bit in the M-bit pattern indicates that the output clock signal should have a negated value during a corresponding clock cycle of the input clock signal. In another implementation, the control circuit of the clock divider receives the indication of the reduction factor as a ratio of N to M by receiving the two values N and M. Here, each of N and M is a positive, non-zero integer, and N is less than M. Therefore, M is also greater than one. In an implementation, the value N is the numerator that indicates a number of clock cycles of each M clock cycles of the input clock signal that the output clock signal is asserted. The value M is the denominator of the ratio. In another implementation, the value N indicates a number of clock cycles of each M clock cycles of the input clock signal that the output clock signal is negated.

In an implementation, the indication of the reduction factor is a 4-bit pattern of 4'b1000 that is received by the control circuit of the clock divider. This received indication of the reduction factor causes the clock divider to generate the output clock signal waveform 304 with an output clock frequency that is ¼ (or 25%) of the input clock frequency of the input clock signal waveform 302. A different 4-bit pattern of 4'b1010 received by the control circuit of the clock divider causes the clock divider to generate the output clock signal waveform 306 with an output clock frequency that is 2/4 (or 50%) of the input clock frequency of the input clock signal waveform 302.

A 4-bit pattern of 4'b1110 received by the control circuit of the clock divider causes the clock divider to generate the output clock signal waveform 308 with an output clock frequency that is ¾ (or 75%) of the input clock frequency of the input clock signal waveform 302. An 8-bit pattern of 8'b11111000 received by the control circuit of the clock divider causes the clock divider to generate the output clock signal waveform 310 with an output clock frequency that is ⅝ (or 62.5%) of the input clock frequency of the input clock signal waveform 302. A 7-bit pattern of 7'b1110101 (not shown) received by the control circuit of the clock divider causes the clock divider to generate the output clock signal waveform 304 with an output clock frequency that is 5/7 (or 71.4%) of the input clock frequency. Other sizes of the M-bit pattern and other ordering of asserted bits within the pattern are possible and contemplated.

Figure 4:
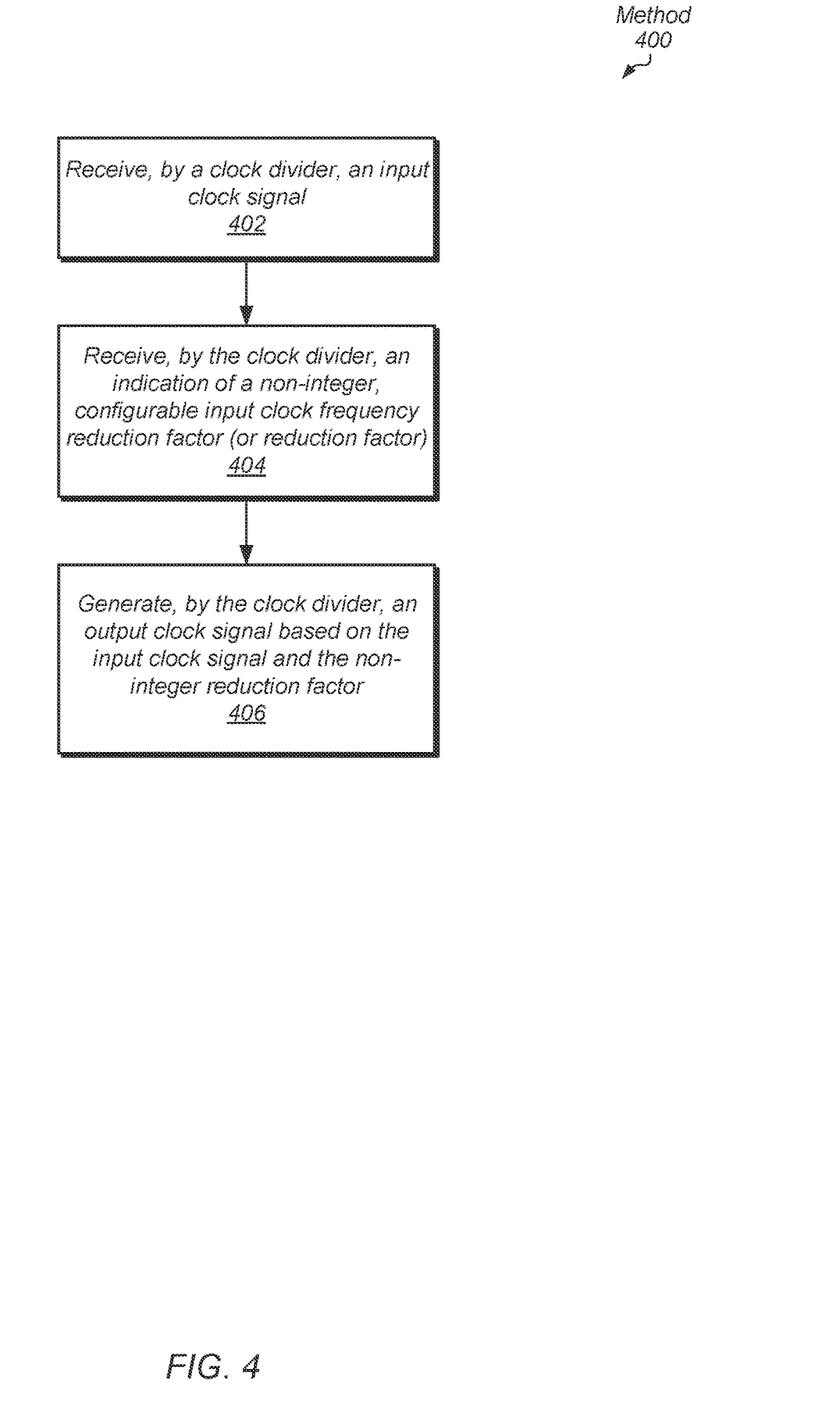
FIG. 4 is a generalized block diagram of a method for efficiently generating clock signals.

Referring to FIG. 4, a generalized block diagram is shown of a method 400 for efficiently generating clock signals. For purposes of discussion, the steps in this implementation (as well as in FIG. 5) are shown in sequential order. However, in other implementations some steps occur in a different order than shown, some steps are performed concurrently, some steps are combined with other steps, and some steps are absent.

An integrated circuit includes multiple clock frequency dividers (or clock dividers) both at its I/O boundaries and within its die. The clock divider receives an input clock signal (block 402). The clock divider also receives an indication of a non-integer, configurable input clock frequency reduction factor (block 404). In various implementations, the configurable input clock frequency reduction factor (or reduction factor) is an M-bit pattern where M is a positive, non-zero integer greater than one. One or more bits of the M-bit pattern, such as a number N bits of the M-bit pattern, indicate a value of clock cycles of the output clock signal that are asserted for every M clock cycles of the input clock signal. In another implementation, the configurable reduction factor is a ratio of N to M where each of N and M is a positive, non-zero integer, and N is less than M. Therefore, M is also greater than one. In an implementation, the value N is a numerator of the ratio that indicates a number of clock cycles of each M clock cycles of the input clock signal that the output clock signal is asserted. The value M is the denominator of the ratio.

In other implementations, the value N of either the M-bit pattern or the N-to-M ratio used to define the configurable reduction factor indicates a number of clock cycles of each M clock cycles of the input clock signal that the output clock signal is negated. The clock divider generates an output clock signal based on the input clock signal and the reduction factor (block 406). Therefore, the clock divider generates the output clock signal with a reduced clock rate that is N/M of the input clock frequency. In other words, the output clock frequency is (N/M)×(input clock frequency). The output clock frequency is a multiplicative product of the ratio N/M and the input clock frequency. Both the supported sizes (or ranges) and the values of N and M determine the output clock frequency. In various implementations, the clock divider generates the output clock signal with a reduced clock rate that has a smallest configurable granularity that is 1/M of the input clock frequency.

Figure 5:
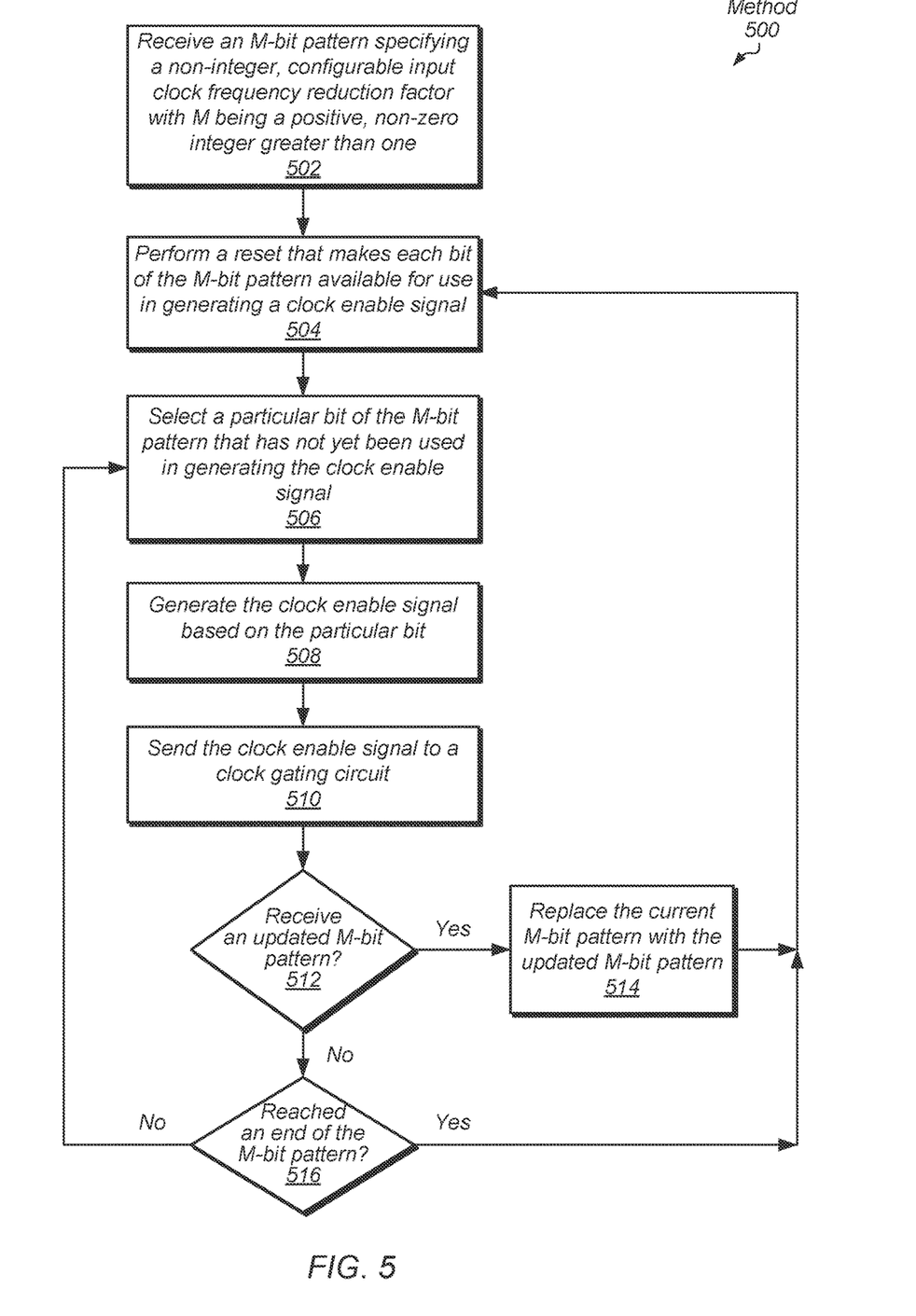
FIG. 5 is a generalized block diagram of a method for efficiently generating clock signals.

Turning now to FIG. 5, a generalized block diagram is shown of a method 500 for efficiently generating clock signals. An integrated circuit includes multiple clock frequency dividers (or clock dividers) both at its I/O boundaries and within its die. The circuitry of the clock divider includes a clock gating circuit that receives the input clock signal and a clock enable signal, and the clock gating circuit generates the output clock signal based on the input clock signal and the clock enable signal. The circuitry of the clock divider also includes a control circuit, which is also referred to as a modulation control block or a modulator. The control circuit receives the input clock signal and the indication of the reduction factor, and generates the clock enable signal used by the clock gating circuit based on the input clock signal and the received indication. In some implementations, the control circuit of the clock divider receives the indication of the reduction factor as an M-bit pattern specifying a non-integer, configurable input clock frequency reduction factor with M being a positive, non-zero integer greater than one (block 502).

In some implementations, the control circuit stores the received M-bit pattern in registers, flip flop circuits, a buffer, or other data storage area. The control circuit performs a reset that makes each bit of the M-bit pattern available for use in generating a clock enable signal (block 504). For example, during a first clock cycle of the input clock signal, each bit of the M-bit pattern is available for use in generating the clock enable signal used by the clock gating circuit. In some implementations, the control circuit uses the M bits of the M-bit pattern in a received order of bits. In another implementation, the control circuit selects the M bits of the M-bit pattern using any order as long as each bit is used only once during any M consecutive clock cycles of the input clock signal. The control circuit selects a particular bit of the M-bit pattern that has not yet been used in generating the clock enable signal (block 506).

The control circuit of the clock divider generates the clock enable signal based on the particular bit (block 508). In an implementation, an asserted bit in the M-bit pattern indicates that the output clock signal should have an asserted value during a corresponding clock cycle of the input clock signal. The clock enable signal is set in a manner to cause the assertion of the output clock signal. Similarly, a negated bit in the M-bit pattern indicates that the output clock signal should have a negated value during a corresponding clock cycle of the input clock signal. The clock enable signal is set in a manner to cause the negation of the output clock signal. In some implementations, a binary '1' is used as an asserted value and a binary '0' is used as a negated value. However, in other implementations, the binary values are switched regarding which one indicates an asserted value and which one indicates a negated value.

The control circuit of the clock divider sends the clock enable signal to the clock gating circuit (block 510). If the control circuit received an updated M-bit pattern ("yes" branch of the conditional block 512), then the control circuit replaces the current M-bit pattern with the updated M-bit pattern (block 514). For example, the control circuit replaces the current M-bit pattern stored in a data storage area with the updated M-bit pattern. Afterward, control flow of method 500 returns to block 504 where the control circuit performs a reset that makes each bit of the M-bit pattern available for use in generating a clock enable signal. Similarly, if the control circuit has not received an updated M-bit pattern ("no" branch of the conditional block 512), and the control circuit has reached the end of the M-bit pattern ("yes" branch of the conditional block 516), then control flow of method 500 returns to block 504.

If the control circuit has not received an updated M-bit pattern ("no" branch of the conditional block 512), and the control circuit has not yet reached the end of the M-bit pattern ("no" branch of the conditional block 516), then control flow of method 500 returns to block 506 where the control circuit selects a particular bit of the M-bit pattern that has not yet been used in generating the clock enable signal. As described earlier, the control circuit selects the M bits of the M-bit pattern using any order as long as each bit is used only once during any M consecutive clock cycles of the input clock signal. It is noted that in other implementations, the above steps of the method 500 are also performed for cases where the control circuit of the clock divider receives the indication of the reduction factor as a ratio of N to M by receiving the two values N and M. Here, each of N and M is a positive, non-zero integer, and N is less than M. Therefore, M is also greater than one. In an implementation, the value N is the numerator of the ratio that indicates a number of clock cycles of each M clock cycles of the input clock signal that the output clock signal is asserted. The value M is the denominator of the ratio. In another implementation, the value N indicates a number of clock cycles of each M clock cycles of the input clock signal that the output clock signal is negated.

Figure 6:
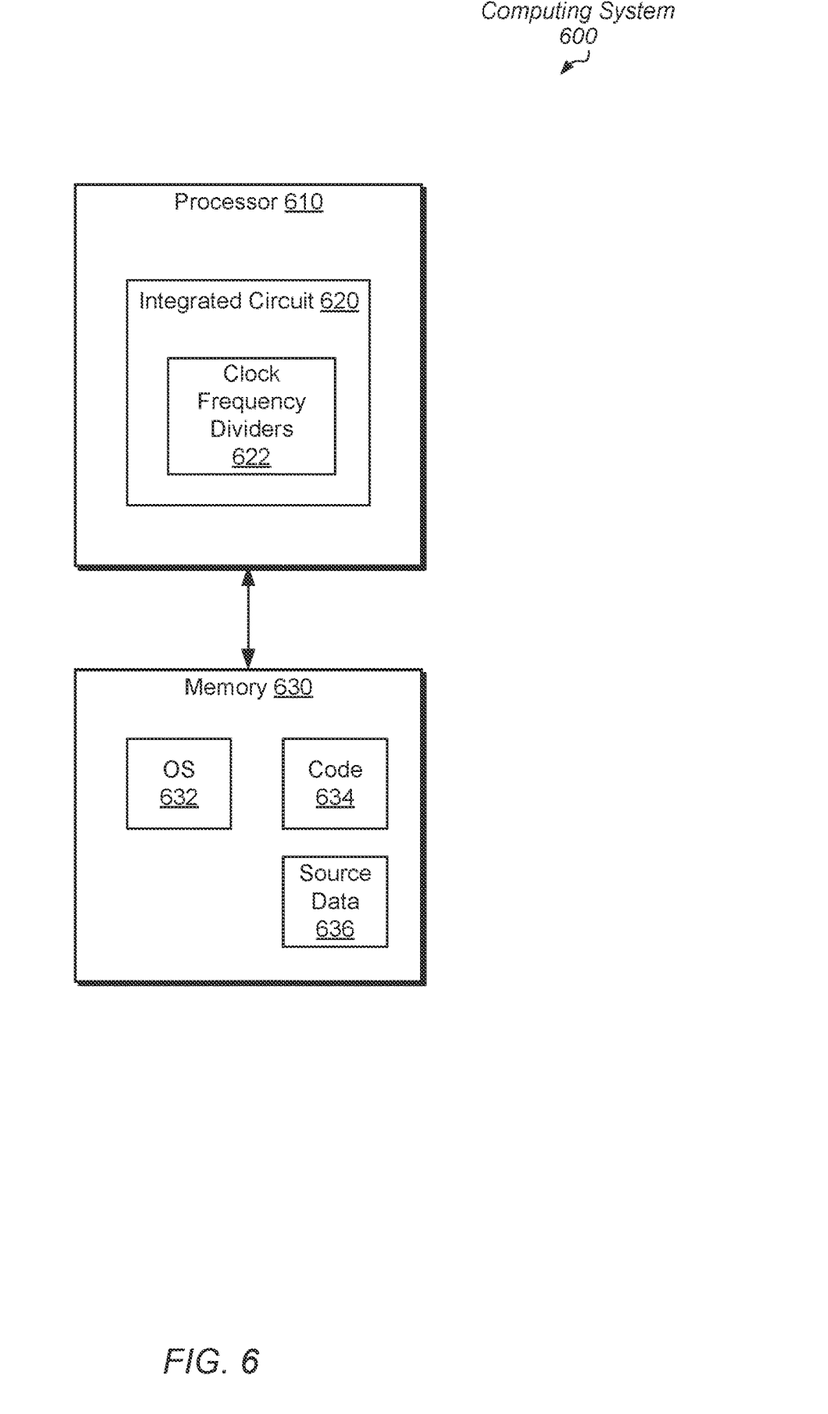
FIG. 6 is a generalized block diagram of a computing system with efficient clock frequency dividers.

Referring to FIG. 6, a generalized block diagram is shown of a computing system 600 with efficient clock frequency dividers. The computing system 600 includes the processor 610 and the memory 630. Interfaces, such as a memory controller, a bus or a communication fabric, one or more phased locked loops (PLLs) and other clock generation circuitry, a power management circuit, and so forth, are not shown for ease of illustration. It is understood that in other implementations, the computing system 600 includes one or more of other processors of a same type or a different type than processor 610, one or more peripheral devices, a network interface, one or more other memory devices, and so forth. In some implementations, the functionality of the computing system 600 is incorporated on a system on chip (SoC). In other implementations, the functionality of the computing system 600 is incorporated on a peripheral card inserted in a motherboard. The computing system 600 is used in any of a variety of computing devices such as a desktop computer, a tablet computer, a laptop, a smartphone, a smartwatch, a gaming console, a personal assistant device, and so forth.

The processor 610 includes hardware such as circuitry. For example, the processor 610 includes at least one integrated circuit 620, which utilizes clock frequency dividers 622. The integrated circuit 620 includes the clock frequency dividers 622 both at its I/O boundaries and within its die. One or more of the clock frequency dividers 622 utilize the circuitry of the clock frequency divider 200 (of FIG. 2) that generates signal waveforms similar to the signal waveforms 300 (of FIG. 3). It is contemplated that the integrated circuit 620 includes any number of clock frequency dividers.

In various implementations, the processor 610 includes one or more processing circuits. In some implementations, each of the processing circuits includes one or more processor cores capable of general-purpose data processing, and an associated cache memory subsystem. In such an implementation, the processor 610 is a central processing unit (CPU). In another implementation, the processing cores are compute circuits, each with a highly parallel data microarchitecture with multiple parallel execution lanes and an associated data storage buffer. In such an implementation, the processor 610 is a graphics processing unit (GPU), a digital signal processor (DSP), or other.

In some implementations, the memory 630 is system memory and includes one of a variety of types of dynamic random access memories (DRAMs). In other implementations, the memory 630 is main memory and includes one or more of a hard disk drive, a solid-state disk, other types of flash memory, a portable solid-state drive, a tape drive and so on. The memory 630 stores an operating system (OS) 632, one or more applications represented by code 634, and at least source data 636. Memory 630 is also capable of storing intermediate result data and final result data generated by the processor 610 when executing a particular application of code 634. Although a single operating system 632 and a single instance of code 634 and source data 636 are shown, in other implementations, another number of these software components are stored in memory 630. The operating system 632 includes instructions for initiating the boot up of the processor 610, assigning tasks to hardware circuitry, managing resources of the computing system 600 and hosting one or more virtual environments.

Each of the processor 610 and the memory 630 includes an interface unit for communicating with one another as well as any other hardware components included in the computing system 600. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g., Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases, the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a clock gating circuit configured to:
generate a output clock signal based on an input clock signal and a clock enable signal; and
send the output clock signal to a sequential circuit; and
a control circuit configured to:
receive the input clock signal;
receive an indication of a reduction factor that is a positive, non-integer value; and
generate the clock enable signal based on the input clock signal and the reduction factor.

2. The apparatus as recited in claim 1, wherein the reduction factor is a non-zero value.

3. The apparatus as recited in claim 1, wherein the control circuit is further configured to receive the indication of the reduction factor as an M-bit pattern comprising a plurality of bits, wherein:
M is a positive, non-zero integer greater than one; and
one or more bits of the M-bit pattern indicate a value of the clock enable signal during a clock cycle of the input clock signal.

4. The apparatus as recited in claim 3, wherein to generate the clock enable signal in a given clock cycle of the input clock signal, the control circuit is configured to select a bit of the M-bit pattern that has not yet been used in generating the clock enable signal during a most recent M clock cycles of the input clock signal.

5. The apparatus as recited in claim 3, wherein the control circuit is further configured to generate the output clock signal with an asserted value during a number of clock cycles of the input clock signal equal to a number of asserted bits of the M-bit pattern.

6. The apparatus as recited in claim 3, wherein the apparatus is further configured to generate the output clock signal such that a first ratio of a given clock frequency of the output clock signal to an input clock frequency of the input clock signal is equal to a second ratio of a number of asserted bits of the M-bit pattern to a total number of bits of the M-bit pattern.

7. The apparatus as recited in claim 3, wherein the control circuit is further configured to receive the indication of the reduction factor as a ratio of N to M, wherein:
each of N and M is a positive, non-zero integer, and N is less than M; and
N indicates a number of clock cycles of each M clock cycles of the input clock signal that the output clock signal is asserted.

8. A method comprising:
receiving, by a sequential circuit, an output clock signal;
receiving, by a clock divider, an input clock signal;
receiving, by the clock divider, an indication of a reduction factor that is a positive, non-integer value; and
generating, by the clock divider, the output clock signal based on the input clock signal and the reduction factor.

9. The method as recited in claim 8, wherein the reduction factor is a non-zero value.

10. The method as recited in claim 8, further comprising receiving, by the clock divider, the indication of the reduction factor as an M-bit pattern comprising a plurality of bits, wherein:
M is a positive, non-zero integer greater than one; and
one or more bits of the M-bit pattern indicate a value of the clock enable signal during a clock cycle of the input clock signal.

11. The method as recited in claim 10, wherein to generate the clock enable signal in a given clock cycle of the input clock signal, the method further comprises selecting, by the clock divider, a bit of the M-bit pattern that has not yet been used in generating the clock enable signal during a most recent M clock cycles of the input clock signal.

12. The method as recited in claim 10, further comprising generating, by the clock divider, the output clock signal with an asserted value during a number of clock cycles of the input clock signal equal to a number of asserted bits of the M-bit pattern.

13. The method as recited in claim 10, further comprising generating, by the clock divider, the output clock signal such that a first ratio of a given clock frequency of the output clock signal to an input clock frequency of the input clock signal is equal to a second ratio of a number of asserted bits of the M-bit pattern to a total number of bits of the M-bit pattern.

14. The method as recited in claim 10, further comprising performing, by the clock divider, a reset that makes each bit of the M-bit pattern available for use in generating the clock enable signal, in response to determining that the clock divider has already used each bit of the M-bit pattern during a most recent number of clock cycles of the input clock signal equal to M.

15. A computing system comprising:
a memory configured to store instructions of one or more tasks and source data to be processed by the one or more tasks;
an integrated circuit configured to execute the instructions using the source data, wherein the integrated circuit comprises:
a sequential circuit configured to receive an output clock signal; and a clock divider configured to:
  receive an input clock signal;
  receive an indication of a reduction factor that is a positive, non-integer value; and
  generate the output clock signal based on the input clock signal and the reduction factor.

16. The computing system as recited in claim 15, wherein the reduction factor is a non-zero value.

17. The computing system as recited in claim 15, wherein the clock divider is further configured to receive the indication of the reduction factor as an M-bit pattern comprising a plurality of bits, wherein:
  M is a positive, non-zero integer greater than one; and
  one or more bits of the M-bit pattern indicate a value of the clock enable signal during a clock cycle of the input clock signal.

18. The computing system as recited in claim 17, wherein to generate the clock enable signal in a given clock cycle of the input clock signal, the clock divider is further configured to select a bit of the M-bit pattern that has not yet been used in generating the clock enable signal during a most recent M clock cycles of the input clock signal.

19. The computing system as recited in claim 17, wherein the clock divider is further configured to generate the output clock signal with an asserted value during a number of clock cycles of the input clock signal equal to a number of asserted bits of the M-bit pattern.

20. The computing system as recited in claim 17, wherein the clock divider is further configured to generate the output clock signal such that a first ratio of a given clock frequency of the output clock signal to an input clock frequency of the input clock signal is equal to a second ratio of a number of asserted bits of the M-bit pattern to a total number of bits of the M-bit pattern.

* * * * *